(12) United States Patent
Vincent et al.

(10) Patent No.: US 11,705,410 B2
(45) Date of Patent: Jul. 18, 2023

(54) SEMICONDUCTOR DEVICE HAVING INTEGRATED ANTENNA AND METHOD THEREFOR

(71) Applicant: NXP USA, INC., Austin, TX (US)

(72) Inventors: Michael B. Vincent, Chandler, AZ (US); Vivek Gupta, Phoenix, AZ (US); Richard Te Gan, Chandler, AZ (US); Kabir Mirpuri, Scottsdale, AZ (US)

(73) Assignee: NXP USA, INC., Austin, TX (US)

( * ) Notice: Subject to any disclaimer, the term of this patent is extended or adjusted under 35 U.S.C. 154(b) by 227 days.

(21) Appl. No.: 17/119,846

(22) Filed: Dec. 11, 2020

(65) Prior Publication Data

US 2022/0189890 A1 Jun. 16, 2022

(51) Int. Cl.
| | |
|---|---|
| *H01L 23/66* | (2006.01) |
| *H01L 23/31* | (2006.01) |
| *H01L 23/538* | (2006.01) |
| *H01L 23/00* | (2006.01) |
| *H01L 21/48* | (2006.01) |
| *H01L 21/56* | (2006.01) |
| *H01Q 1/38* | (2006.01) |

(52) U.S. Cl.
CPC .......... *H01L 23/66* (2013.01); *H01L 21/4853* (2013.01); *H01L 21/4857* (2013.01); *H01L 21/565* (2013.01); *H01L 23/3121* (2013.01); *H01L 23/5383* (2013.01); *H01L 23/5386* (2013.01); *H01L 23/5389* (2013.01); *H01L 24/19* (2013.01); *H01L 24/20* (2013.01); *H01Q 1/38* (2013.01); *H01L 2223/6622* (2013.01); *H01L 2223/6677* (2013.01); *H01L 2224/214* (2013.01)

(58) Field of Classification Search
CPC . H01L 23/66; H01L 21/4853; H01L 21/4857; H01L 21/565; H01L 23/3121; H01L 23/5383; H01L 23/5386; H01L 23/5389; H01L 24/19; H01L 24/20; H01L 2223/6622; H01L 2223/6677; H01L 2224/214; H01Q 1/38
See application file for complete search history.

(56) References Cited

U.S. PATENT DOCUMENTS

| | | | |
|---|---|---|---|
| 7,911,014 B2 | 3/2011 | Doan | |
| 7,943,404 B2 | 5/2011 | Ding et al. | |
| 8,547,278 B2 | 10/2013 | Jun et al. | |
| 9,425,174 B1 * | 8/2016 | Hin | H01L 23/49811 |

(Continued)

OTHER PUBLICATIONS

Tanaka, M., "High Frequency Characteristics of Glass Interposer", 2020 IEEE 70th Electronic Components and Technology Conference (ECTC), Jun. 3-30, 2020.

(Continued)

*Primary Examiner* — Kyoung Lee
*Assistant Examiner* — Christina A Sylvia

(57) ABSTRACT

A semiconductor device having an integrated antenna is provided. The semiconductor device includes a base die having an integrated circuit formed at an active surface and a cap die bonded to the backside surface of the base die. A metal trace is formed over a top surface of the cap die. A cavity is formed under the metal trace. A conductive via is formed through the base die and the cap die interconnecting the metal trace and a conductive trace of the integrated circuit.

20 Claims, 6 Drawing Sheets

(56) References Cited

U.S. PATENT DOCUMENTS

| | | | |
|---|---|---|---|
| 10,490,479 B1* | 11/2019 | Wan | H01L 23/3128 |
| 10,923,408 B2 | 2/2021 | Huang et al. | |
| 2011/0262736 A1* | 10/2011 | Sumi | B32B 7/04 |
| | | | 428/316.6 |
| 2019/0198407 A1* | 6/2019 | Huang | H01L 23/04 |
| 2019/0312331 A1* | 10/2019 | Sakurai | B32B 5/26 |

OTHER PUBLICATIONS

Yu, P., "Coaxial Through-Silicon-Vias Using Low-κ SiO2 Insulator", 2020 IEEE 70th Electronic Components and Technology Conference (ECTC), Jun. 3-30, 2020.

* cited by examiner

US 11,705,410 B2

SEMICONDUCTOR DEVICE HAVING INTEGRATED ANTENNA AND METHOD THEREFOR

BACKGROUND

Field

This disclosure relates generally to semiconductor device packaging, and more specifically, to a semiconductor device having an integrated antenna and method of forming the same.

Related Art

Today, there is an increasing trend to include sophisticated semiconductor devices in products and systems that are used throughout various market segments every day. As technology progresses, manufacturers continue to advance the performance and reliability goals to meet expectations of these sophisticated semiconductor devices. However, significant challenges exist to contain or reduce cost while meeting such expectations of these devices.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Generally, there is provided, a compact semiconductor device having an integrated antenna. A base die including an integrated circuit is bonded with a cap die. The integrated circuit is configured to receive and/or transmit radio frequency signals. A metal trace is formed at a top surface of the cap die and configured as an integrated antenna. The metal trace at the top surface of the cap die is interconnected with the integrated circuit of the base die by way of a conductive via formed through the cap die and the base die. A cavity is formed under the metal trace and is configured for optimized propagation of the radio frequency signals. Forming the semiconductor device in this manner provides significantly shorter signal line lengths and reduced RF transmission losses allowing for receive and/or transmit of significantly higher signal frequencies (e.g., greater than 100 GHz).

Figure 1:
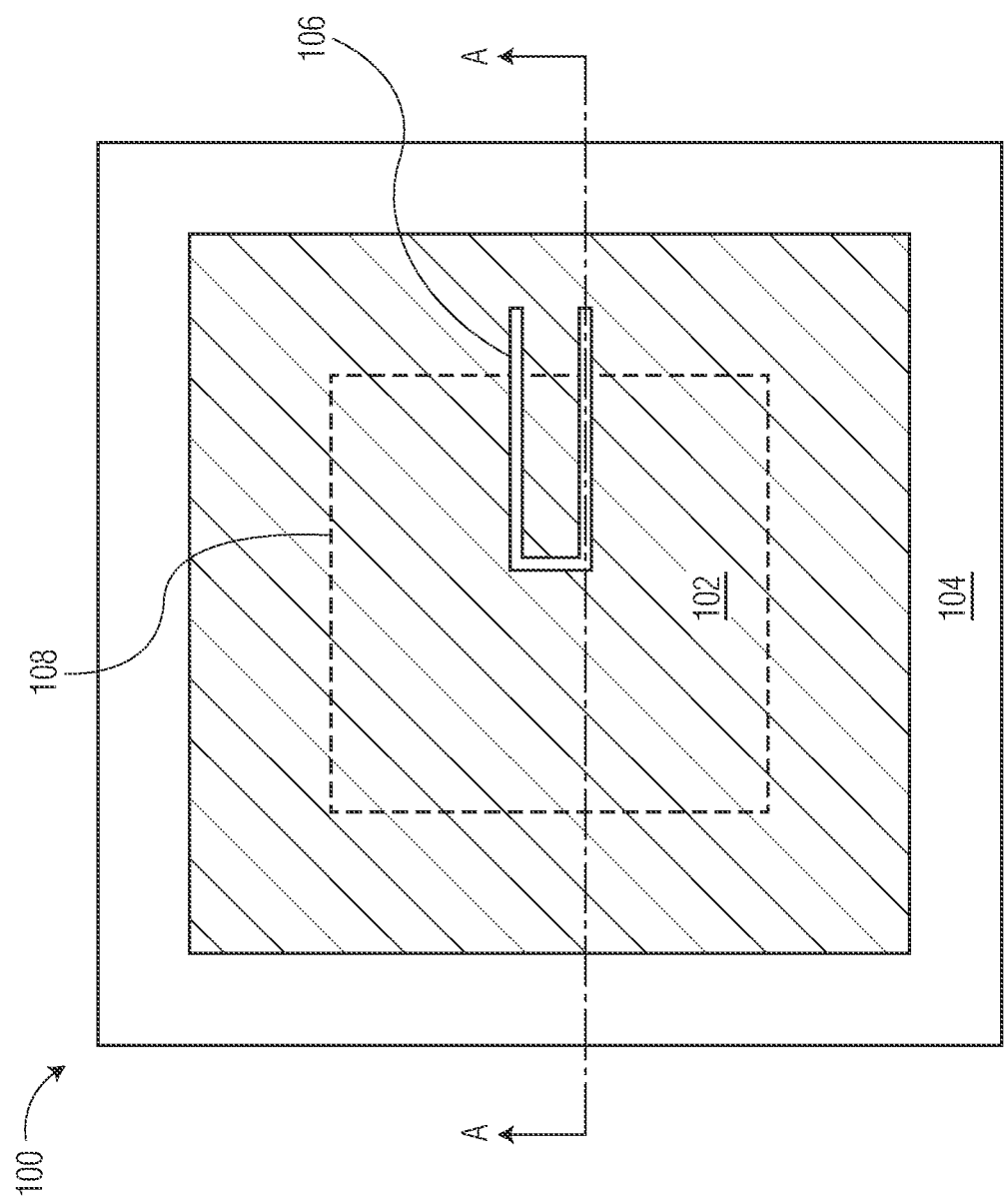
FIG. 1 illustrates, in a simplified plan view, an example semiconductor device having an integrated antenna in accordance with an embodiment.
Figure 3:
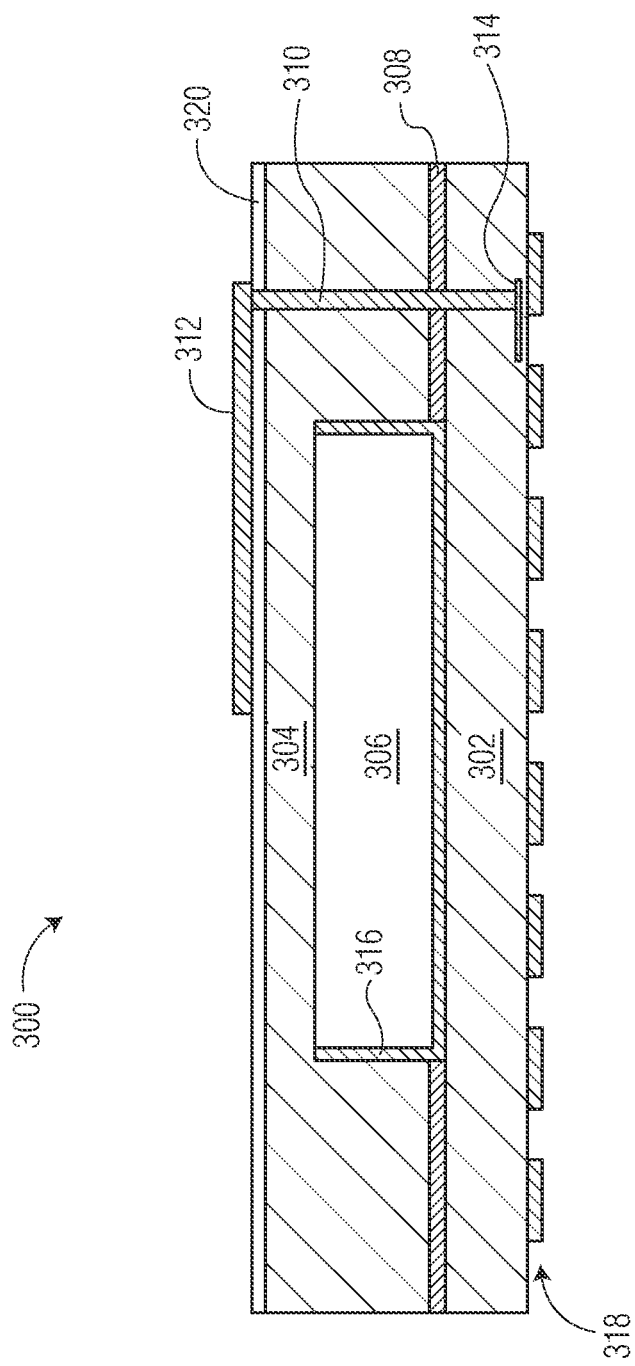
FIG. 3 illustrates, in a simplified cross-sectional view, an alternative example semiconductor device in accordance with an embodiment.
Figure 4:
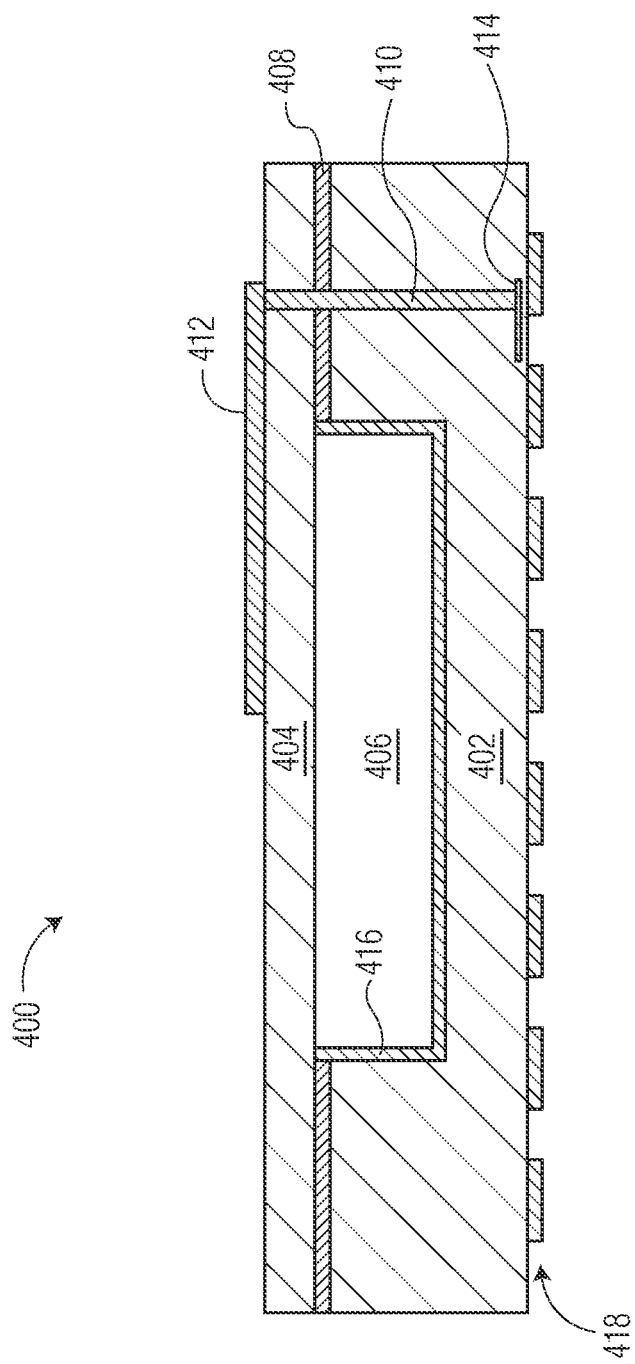
FIG. 4 illustrates, in a simplified cross-sectional view, another alternative example semiconductor device in accordance with an embodiment.

FIG. 1 illustrates, in a simplified plan view, an example semiconductor device 100 having an integrated antenna in accordance with an embodiment. The device 100 includes a bonded die 102 mounted on a package substrate 104. The bonded die 102 includes a metal trace configured as an integrated antenna 106 at a top surface. A cavity 108 is embedded in the bonded die 102 having a perimeter indicated by the dashed line labeled 108. A portion of the integrated antenna 106 is formed over the underlying cavity 108. In this embodiment, the bonded die 102 is formed as a base die wafer and a cap die wafer bonded together to form a bonded wafer. The bonded wafer is singulated into a plurality of individual bonded die. Cross-sectional views of examples of the semiconductor device 100 having an integrated antenna taken along line A-A are depicted in FIG. 2 through FIG. 4.

Figure 2:
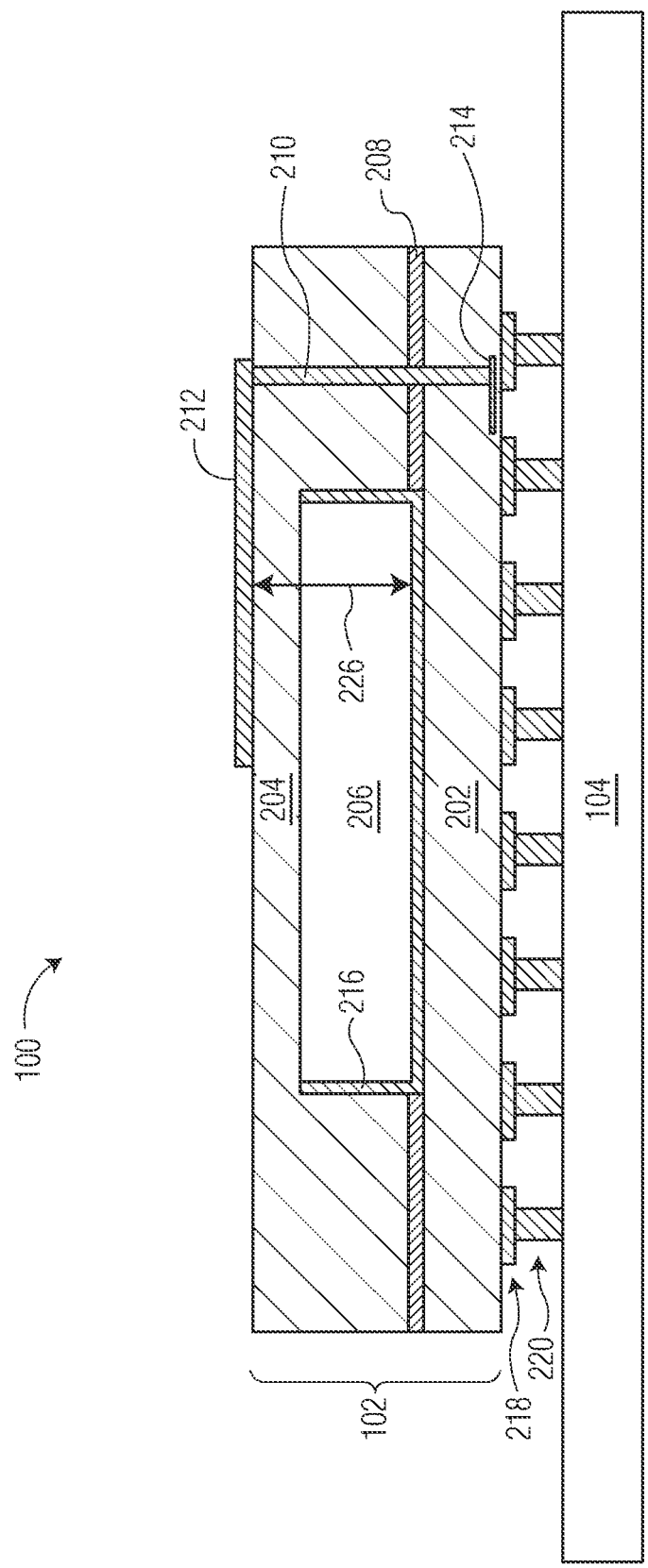
FIG. 2 illustrates, in a simplified cross-sectional view, the example semiconductor device of FIG. 1 in accordance with an embodiment.

FIG. 2 illustrates, in a simplified cross-sectional view, the example semiconductor device 100 of FIG. 1 in accordance with an embodiment. In this embodiment, a base die 202 is bonded with a cap die 204 along a bond interface 208 to form bonded die 102. The bonded die 102 is singulated from a bonded wafer formed as a base die wafer and a cap die wafer bonded together. The base die wafer and the cap die wafer may be bonded together forming a bond interface 208 using known methods and techniques such as adhesive bonding, eutectic bonding, glass frit bonding, thermal compression bonding, and the like. Bond pads 218 at an active surface of the base die 202 are configured for attachment and interconnection with the package substrate 104 by way of conductive connectors 220. The conductive connectors 220 may be any suitable conductive connector structure such as solder bumps, gold studs, copper pillars, and the like.

The base die 202 has an active surface (e.g., major surface having circuitry, bond pads) and a backside surface (e.g., major surface opposite of the active surface). An integrated circuit (IC) is formed at the active surface and connected to a conductive trace 214 at the active surface of the base die 202. The bond pads 218 are formed at the active surface and are interconnected with the IC at the active surface of the base die 202. The base die 202 may be formed from any suitable semiconductor material, such as silicon, germanium, gallium arsenide, gallium nitride, silicon carbide, and the like. In this embodiment, the IC is configured to receive and/or transmit radio frequency (RF) such as mmWave signals having a frequency range of 30 GHz to 300 GHz, for example.

The cap die 204 has a top surface and a bottom surface (e.g., major surface opposite of the top surface). In this embodiment, a cavity 206 is formed at the bottom surface of the cap die. A metal (e.g., copper) layer 216 is formed on sidewall and bottom surfaces of the cavity. For example, the metal layer 216 portion on the bottom surface of the cavity 206 may be formed on the backside surface of the base die 202 such that when bonded with the cap die 204, a substantially continuous metal layer 216 is formed on the sidewall and bottom surfaces. The cap die 204 may be formed from suitable materials such as silicon and glass materials. For example, it may be desirable to form the cap die 204 from a fused quartz glass material to have less scattering loss. The cavity 206 may be hollow (e.g., filled with air, gas) or filled with a low dielectric loss solid material such as fused quartz or fused silica glass.

A metal (e.g., copper) trace 212 is formed at the top surface of the cap die 204. A portion of the metal trace 212 overhangs a portion of the underlying cavity 206. A portion of the cap die 204 remains between the metal trace 212 and the cavity 206. The metal trace 212 is configured and arranged as the integrated antenna 106 depicted in FIG. 1. In this embodiment, a predetermined distance 226 from the bottom of the cavity 206 to the metal trace 212 is configured for optimized propagation of RF signals. For example, the predetermined distance 226 may be configured as a quarter-wavelength (e.g., 214) of a desired transmit and/or receive frequency for improved bandwidth. A conductive through via 210 is formed through the base die 202 and the cap die 204. The via 210 is configured and arranged to interconnect the metal trace 212 integrated at the top surface of the cap die 204 with the conductive trace 214 of the integrated circuit at the active surface of the base die 202.

The package substrate 104 is interconnected with the IC of the base die 202 by way of the bond pads 218 and respective conductive connectors 220. The package substrate 104 may be formed as a multi-layer laminate structure having conductive features (e.g., metal traces, pads) separated by non-conductive material (e.g., FR-4). In this embodiment, the package substrate 104 is characterized as a chip scale package (CSP) type package substrate.

FIG. 3 illustrates, in a simplified cross-sectional view, an alternative example semiconductor device 300 in accordance with an embodiment. In this embodiment, a base die 302 is bonded with a cap die 304 along a bond interface 308 to form a bonded die. The bonded die is singulated from a bonded wafer formed as a base die wafer and a cap die wafer bonded together. The base die wafer and the cap die wafer may be bonded together forming a bond interface 308 using known methods and techniques such as adhesive bonding, eutectic bonding, glass frit bonding, thermal compression bonding, and the like. Bond pads 318 at an active surface of the base die 302 are configured for attachment and interconnection with a package substrate, for example.

The base die 302 has an active surface (e.g., major surface having circuitry, bond pads) and a backside surface (e.g., major surface opposite of the active surface). An IC is formed at the active surface and connected to a conductive trace 314 at the active surface of the base die 302. The bond pads 318 are formed at the active surface and are interconnected with the IC at the active surface of the base die 302. The base die 302 may be formed from any suitable semiconductor material, such as silicon, germanium, gallium arsenide, gallium nitride, silicon carbide, and the like. In this embodiment, the IC is configured to receive and/or transmit RF such as mmWave signals, for example.

The cap die 304 has a top surface and a bottom surface (e.g., major surface opposite of the top surface). In this embodiment, a cavity 306 is formed at the bottom surface of the cap die. A metal (e.g., copper) layer 316 is formed on sidewall and bottom surfaces of the cavity. The cap die 304 may be formed from suitable materials such as silicon and glass materials. The cavity 306 may be hollow or filled with a low dielectric loss solid material such as fused quartz or fused silica glass. In this embodiment, a dielectric (e.g., silicon oxide or polymeric dielectric material) layer 320 is applied at the top surface of the cap die 304. A metal (e.g., copper) trace 312 is formed on the dielectric layer 320. A portion of the metal trace 312 overhangs a portion of the underlying cavity 306. A portion of the cap die 304 remains between the metal trace 312 and the cavity 306. The metal trace 312 is configured and arranged as the integrated antenna 106 depicted in FIG. 1. A conductive through via 310 is formed through the base die 302, the cap die 304, and dielectric layer 320. The via 310 is configured and arranged to interconnect the metal trace 312 integrated at the top surface of the cap die 304 with the conductive trace 314 of the integrated circuit at the active surface of the base die 302.

FIG. 4 illustrates, in a simplified cross-sectional view, an alternative example semiconductor device 400 in accordance with an embodiment. In this embodiment, a base die 402 is bonded with a cap die 404 along a bond interface 408 to form a bonded die. The bonded die is singulated from a bonded wafer formed as a base die wafer and a cap die wafer bonded together. The base die wafer and the cap die wafer may be bonded together forming a bond interface 408 using known methods and techniques such as adhesive bonding, eutectic bonding, thermal compression bonding, and the like. Bond pads 418 at an active surface of the base die 402 are configured for attachment and interconnection with a package substrate, for example.

The base die 402 has an active surface (e.g., major surface having circuitry, bond pads) and a backside surface (e.g., major surface opposite of the active surface). An IC is formed at the active surface and connected to a conductive trace 414 at the active surface of the base die 402. The bond pads 418 are formed at the active surface and are interconnected with the IC at the active surface of the base die 402. In this embodiment, a cavity 406 is formed at the backside surface of the base die 402. A metal (e.g., copper) layer 416 is formed on sidewall and bottom surfaces of the cavity 406. The cavity 406 may be hollow or filled with a low dielectric loss solid material such as fused quartz or fused silica glass. The base die 402 may be formed from any suitable semiconductor material, such as silicon, germanium, gallium arsenide, gallium nitride, silicon carbide, and the like. In this embodiment, the IC is configured to receive and/or transmit RF such as mmWave signals, for example.

The cap die 404 has a top surface and a bottom surface (e.g., major surface opposite of the top surface). The cap die 404 may be formed from suitable materials such as silicon and glass materials. A metal (e.g., copper) trace 412 is formed at the top surface of the cap die 404. A portion of the metal trace 412 overhangs a portion of the underlying cavity 406. The metal trace 412 is configured and arranged as the integrated antenna 106 depicted in FIG. 1. A conductive through via 410 is formed through the base die 402 and the cap die 404. The via 410 is configured and arranged to interconnect the metal trace 412 integrated at the top surface of the cap die 404 with the conductive trace 414 of the integrated circuit at the active surface of the base die 402.

Figure 5:
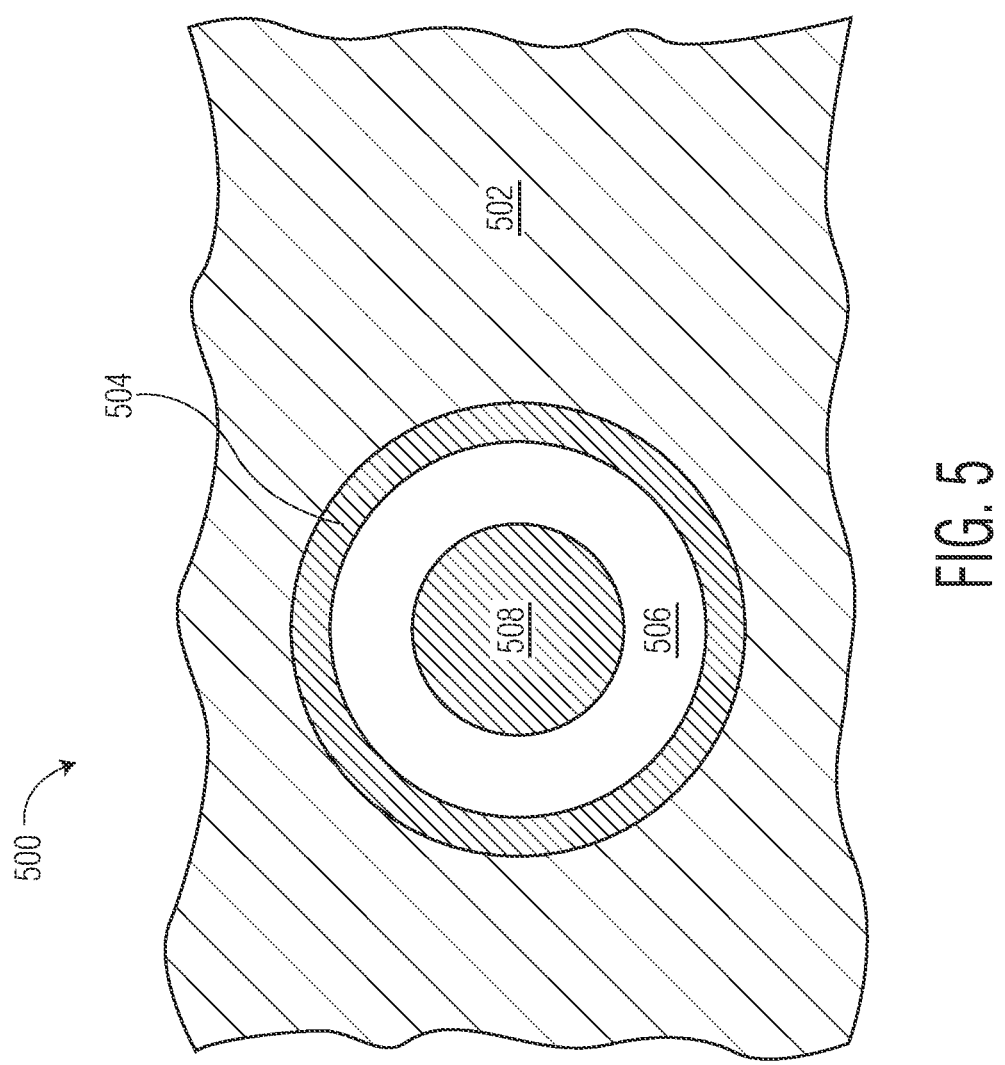
FIG. 5 illustrates, in a simplified cross-sectional view, an example coaxial conductive via of a semiconductor device having an integrated antenna in accordance with an embodiment.

FIG. 5 illustrates, in a simplified cross-sectional view, an example coaxial conductive via 500 of a semiconductor device having an integrated antenna in accordance with an embodiment. In the embodiments depicted in FIG. 2 through FIG. 4, the conductive vias 210, 310, 410 may each be formed alternatively as a coaxial via configured for carrying high frequency RF signals. The cross-sectional view of the via 500 depicts a wafer portion 502 having a central metal (e.g., copper) conductor 508 surrounded by a dielectric (e.g., low-k silicon dioxide) material 506. A metal shield layer 504 surrounds the dielectric material 506 and is configured as a grounded shield. The diameter of the conductor 508 and spacing distance to the shield layer 504 are predetermined for minimal signal loss and interference while transmitting and/or receiving high frequency signals.

Figure 6:
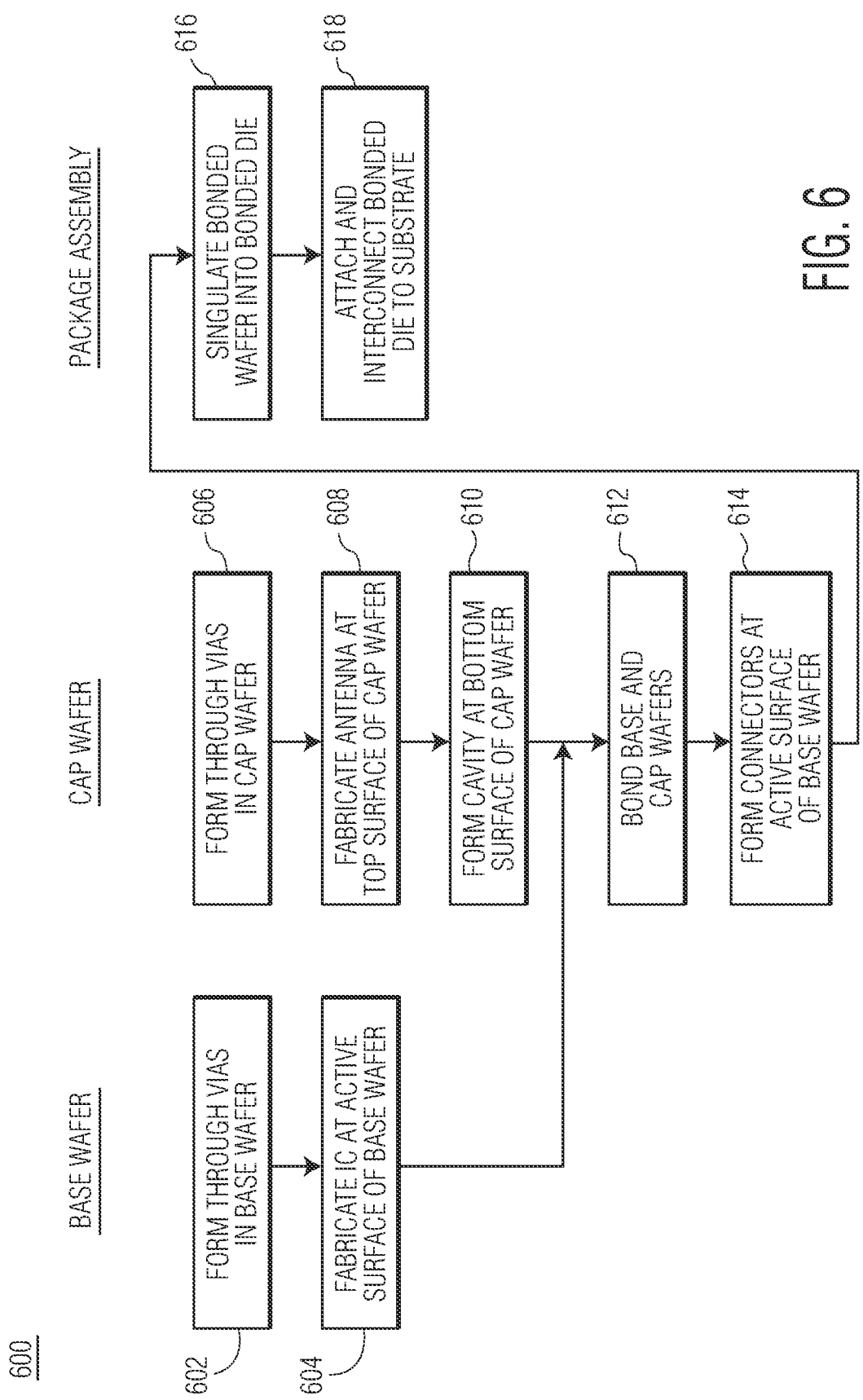
FIG. 6 illustrates, in a simplified flow diagram form, an example method of forming a semiconductor device having an integrated antenna in accordance with an embodiment.

FIG. 6 illustrates, in a simplified flow diagram form, an example method 600 of forming a semiconductor device having an integrated antenna in accordance with an embodiment. In this embodiment, steps 602-604 of the method 600 include forming a base die wafer and steps 606-610 include forming a cap die wafer. Steps 612-618 include forming individual bonded die package assembly.

At step 602, form through vias in the base die wafer. In this embodiment, a conductive through via is formed for each base die site of the base wafer. The vias of the base wafer may be formed as a solid metal, plated through hole, or coaxial conductor. The vias are formed from a suitable metal material such as copper, for example.

At step 604, fabricate an integrated circuit IC at the active surface of the base wafer. In this embodiment, the IC is fabricated for each base die site of the base wafer. The IC may include circuitry configured to transmit and/or receive RF signals, for example. A conductive trace is fabricated along with the IC at the active surface of the base wafer to interconnect the IC with a respective conductive via.

At step 606, form through vias in the cap die wafer. In this embodiment, a conductive through via is formed for each cap die site of the cap wafer. The vias of the cap wafer are formed to match the structure (e.g., solid metal, plated through hole, coaxial), material (e.g., copper) and corresponding location of the vias formed in the base wafer.

At step 608, fabricate antenna at top surface of the cap die wafer. In this embodiment, a metal (e.g., copper) trace is fabricated for each cap die site of the cap wafer. The metal trace is configured and arranged as an integrated antenna and connected to a respective conductive via. The cap die may be formed from suitable materials such as silicon and glass materials. For example, it may be desirable to form the cap die from a fused quartz glass material to have less scattering loss.

At step 610, form cavity at bottom surface of the cap die wafer. In this embodiment, a cavity is formed at the bottom surface for each cap die site of the cap wafer. A metal (e.g., copper) layer is formed on sidewall surfaces of the cavity. When bonded with the base die, a substantially continuous metal layer is formed on the sidewall and bottom surfaces of the cavity. The cavity may be hollow (e.g., filled with air, gas) or filled with a low dielectric loss solid material such as fused quartz or fused silica glass. The cavity is located below the antenna such that a portion of the antenna overhangs the underlying cavity. In this embodiment, a predetermined distance from the bottom of the cavity to the antenna is configured for optimized propagation of RF signals. For example, the predetermined distance may be configured as a quarter-wavelength (e.g., $\lambda/4$) of a desired transmit and/or receive frequency for improved bandwidth.

At step 612, bond base and cap wafers. In this embodiment, the base wafer and the cap wafer are aligned and bonded together to form a bonded wafer. The base die wafer and the cap die wafer may be bonded together using known methods and techniques such as adhesive bonding, eutectic bonding, glass frit bonding, thermal compression bonding, and the like. When bonded together, vias formed in the cap wafer are aligned with vias formed in the base wafer such that a continuous via is formed from the metal trace to the conductive trace of the IC for each die site of the bonded wafer. In this embodiment, a portion of the backside surface of the base die serves as the bottom surface of the cavity when the bonded wafer is formed. Accordingly, a metal (e.g., copper) layer is formed on the portion of the backside surface of the base die such that when the bonded wafer is formed, the sidewall surfaces and bottom surface of the cavity have a continuous metal layer.

At step 614, form connectors at the active surface of the base wafer. In this embodiment, conductive connectors are formed for each base die site of the bonded wafer. Bond pads at the active surface of the base die are configured for attachment and interconnection with a package substrate by way of the conductive connectors, for example. The conductive connectors may be any suitable conductive connector structure such as solder bumps, gold studs, copper pillars, and the like.

At step 616, singulate bonded wafer into bonded die. In this embodiment, each bonded die unit of a plurality of bonded die units formed in the bonded wafer is singulated. The resulting individual units may be provided for attachment to a package substrate.

At step 618, attach and interconnect bonded die to substrate. In this embodiment, after singulating the bonded wafer into a plurality of bonded die, individual bonded die are attached and interconnected to respective package substrates by way of the conductive connectors formed at the active side of the boned die.

Generally, there is provided, a semiconductor device including a base die having an active surface and a backside surface, an integrated circuit formed at the active surface; a cap die having a top surface and a bottom surface, the bottom surface of the cap die bonded to the backside surface of the base die; a metal trace formed over the top surface of the cap die; a conductive via formed through the base die and the cap die, the conductive via interconnecting the metal trace and a conductive trace of the integrated circuit; and a cavity formed under the metal trace, a portion of the cap die remaining between the metal trace and the cavity. The semiconductor device may further include a metal layer formed on sidewall surfaces and a bottom surface of the cavity. The metal trace may be configured and arranged as an antenna coupled to the integrated circuit by way of the conductive via. A bottom surface of the cavity may be separated from the antenna by a predetermined distance, the predetermined distance sufficient for propagation of a mmWave signal. The semiconductor device may further include a dielectric layer disposed between the metal trace and the top surface of the cap die. The cavity may be formed in the cap die before the cap die is bonded to the base die. The conductive via may be formed as a coaxial connection between the metal trace and the conductive trace of the integrated circuit. The semiconductor device may further include a plurality of bond pads formed on the active surface of the base die, the plurality of bond pads configured for connection to a package substrate. The plurality of bond pads may be connected to the package substrate by way of copper pillars or solder bumps.

In another embodiment, there is provided, a method including forming a cavity in a cap die; forming a metal trace over a top surface of the cap die and the cavity, a portion of the cap die located between the metal trace and the cavity; bonding a bottom surface of the cap die with a backside surface of a base die, the base die including an integrated circuit formed at an active surface; and interconnecting the metal trace and a conductive trace of the integrated circuit by way of a through via formed through the cap die and the base die. The method may further include forming a metal layer on sidewall surfaces and a bottom surface of the cavity. The metal trace may be configured and arranged as an antenna coupled to the integrated circuit by way of the through via. The method may further include forming a dielectric layer on the top surface of the cap die, the metal trace formed on the dielectric layer. The method may further include filling the cavity with a quartz glass material. The through via may be formed as a coaxial connection between the metal trace and the conductive trace of the integrated circuit. The method may further include forming a plurality of conductive connectors on a respective plurality of bond pads at the active surface of the base die, the plurality of conductive connectors configured and arranged for interconnecting the integrated circuit with a printed circuit board or a package substrate.

In yet another embodiment, there is provided, a semiconductor device including a base die having an active surface and a backside surface, an integrated circuit formed at the active surface; a cap die having a top surface and a bottom surface, the bottom surface of the cap die bonded to the backside surface of the base die; an antenna formed over the top surface of the cap die; a conductive via formed through the base die and the cap die, the conductive via interconnecting the antenna and a conductive trace of the integrated circuit; and a cavity formed under the antenna, a portion of the cap die remaining between the metal trace and the cavity. The semiconductor device may further include a metal layer formed on sidewall surfaces and a bottom surface of the cavity. A bottom surface of the cavity may be separated from the antenna by a predetermined distance, the predetermined distance sufficient for propagation of a mmWave signal. The semiconductor device may further include a dielectric layer disposed between the antenna and the top surface of the cap die.

By now, it should be appreciated that there has been provided a compact semiconductor device having an integrated antenna. A base die including an integrated circuit is bonded with a cap die. The integrated circuit is configured to receive and/or transmit radio frequency signals. A metal trace is formed at a top surface of the cap die and configured as an integrated antenna. The metal trace at the top surface of the cap die is interconnected with the integrated circuit of the base die by way of a conductive via is formed through the cap die and the base die. A cavity is formed under the metal trace and is configured for optimized propagation of the radio frequency signals. Forming the semiconductor device in this manner provides significantly shorter signal line lengths allowing for receive and/or transmit of significantly higher signal frequencies (e.g., greater than 100 GHz).

The terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A semiconductor device comprising:
   a base die having an active surface and a backside surface, an integrated circuit formed at the active surface;
   a cap die having a top surface and a bottom surface, the bottom surface of the cap die bonded to the backside surface of the base die;
   a metal trace formed over the top surface of the cap die;
   a dielectric layer disposed between the metal trace and the top surface of the cap die;
   a conductive via formed through the base die and the cap die, the conductive via interconnecting the metal trace and a conductive trace of the integrated circuit; and
   a cavity formed under the metal trace, a portion of the cap die remaining between the metal trace and the cavity.

2. The semiconductor device of claim 1, further comprising a metal layer formed on sidewall surfaces and a bottom surface of the cavity.

3. The semiconductor device of claim 1, wherein the metal trace is configured and arranged as an antenna coupled to the integrated circuit by way of the conductive via.

4. The semiconductor device of claim 3, wherein a bottom surface of the cavity is separated from the antenna by a predetermined distance, the predetermined distance sufficient for propagation of a mmWave signal.

5. The semiconductor device of claim 1, wherein the cavity is formed in the cap die before the cap die is bonded to the base die.

6. The semiconductor device of claim 1, wherein the conductive via is formed as a coaxial connection between the metal trace and the conductive trace of the integrated circuit.

7. The semiconductor device of claim 1, further comprising a plurality of bond pads formed on the active surface of the base die, the plurality of bond pads configured for connection to a package substrate.

8. The semiconductor device of claim 7, wherein the plurality of bond pads is connected to the package substrate by way of copper pillars or solder bumps.

9. A method comprising:
   forming a cavity in a cap die;
   forming a metal trace over a top surface of the cap die and the cavity, a portion of the cap die located between the metal trace and the cavity, a dielectric layer disposed between the metal trace and the top surface of the cap die;
   bonding a bottom surface of the cap die with a backside surface of a base die, the base die including an integrated circuit formed at an active surface; and
   interconnecting the metal trace and a conductive trace of the integrated circuit by way of a through via formed through the cap die and the base die.

10. The method of claim 9, further comprising forming a metal layer on sidewall surfaces and a bottom surface of the cavity.

11. The method of claim 9, wherein the metal trace is configured and arranged as an antenna coupled to the integrated circuit by way of the through via.

12. The method of claim 9, further comprising depositing the dielectric layer on the top surface of the cap die before forming the metal trace.

13. The method of claim 9, further comprising filling the cavity with a quartz glass material.

14. The method of claim 9, wherein the through via is formed as a coaxial connection between the metal trace and the conductive trace of the integrated circuit.

15. The method of claim 9, further comprising forming a plurality of conductive connectors on a respective plurality of bond pads at the active surface of the base die, the plurality of conductive connectors configured and arranged for interconnecting the integrated circuit with a printed circuit board or a package substrate.

16. A semiconductor device comprising:
   a base die having an active surface and a backside surface, an integrated circuit formed at the active surface;
   a cap die having a top surface and a bottom surface, the bottom surface of the cap die bonded to the backside surface of the base die;
   an antenna formed over the top surface of the cap die;
   a dielectric layer disposed between the antenna and the top surface of the cap die;
   a conductive via formed through the base die and the cap die, the conductive via interconnecting the antenna and a conductive trace of the integrated circuit; and
   a cavity formed under the antenna, a portion of the cap die remaining between the metal trace and the cavity.

17. The semiconductor device of claim 16, further comprising a metal layer formed on sidewall surfaces and a bottom surface of the cavity.

18. The semiconductor device of claim 16, wherein a bottom surface of the cavity is separated from the antenna by a predetermined distance, the predetermined distance sufficient for propagation of a mmWave signal.

19. The semiconductor device of claim 16, wherein the conductive via is formed as a coaxial connection between the antenna and the conductive trace of the integrated circuit.

20. The semiconductor device of claim 16, wherein the cavity is filled with a quartz glass material.

\* \* \* \* \*